SEMICONDUCTOR DEVICES

Filed Aug. 24, 1970 4 Sheets-Sheet 1

INVENTOR.
Uryon S. Davidsohn
BY
Mueller & Aichele
ATTORNEYS

INVENTOR.
Uryon S. Davidsohn
BY
Mueller & Aichele
ATTORNEYS

SEMICONDUCTOR DEVICES

INVENTOR.
Uryon S. Davidsohn
BY
*Mueller & Aichele*
ATTORNEYS

INVENTOR.
Uryon S. Davidsohn
BY
Mueller & Aichele
ATTORNEYS 3,738,877
SEMICONDUCTOR DEVICES
Uryon S. Davidsohn, Scottsdale, Ariz., assignor to Motorola, Inc., Franklin Park, Ill.
Filed Aug. 24, 1970, Ser. No. 66,164
Int. Cl. H01l 7/00, 7/64, 19/00
U.S. Cl. 148—175 4 Claims

ABSTRACT OF THE DISCLOSURE

Various devices are described herein utilizing anisotropic etching and dielectric isolations as means for limiting areas of either conductivity type semiconductor material. Surface junctions normally found in the diffused semiconductor devices of the prior art are also eliminated by the use of overlap diffusion techniques. Anisotropic etching is employed in certain of the devices for attaining buried PN junctions.

BACKGROUND OF THE INVENTION

In prior art devices the surface fringing fields generated by diffusions of a doping compound into semiconductor material are created through existing manufacturing techniques. Another form of fringing field can be found in snap diodes and hot carrier Schottky type diodes which degrade the performance of such devices. An additional problem found in prior art devices is the storage of minority carriers in a lateral fashion away from the area directly below the junction used in forming the device. This can be described with relation to a diode in the following manner. In a diode wherein the charge is stored partially under the junction and partially displaced from under the junction, that charge located immediately under the junction is swept out of the diode body immediately upon the reversal of the electrical potential applied across the diode while the charge stored laterally away from the junction takes a finite time to move under the junction and be swept out. Transistor performance is improved by eliminating the surface PN junction and its resulting fringe field occurring beneath the surface of the semiconductor device. The elimination of the surface base-collector PN junction also eliminates lateral charge stored outside of said base area. This laterally stored charge degrades transistor action during recovery time. During such time interval as a transistor is switched from one state to another, not only must the collector stored charge under the base be swept out or be recombined, but also the residual laterally stored charge must be eliminated before the collector voltage can rise. By the geometry explained hereinafter, the present invention avoids laterally stored charge through the utilization of buried PN junctions and anisotropic etching. An additional feature of the invention is the provision of a buried layer and its associated graded field which helps to force collector storage charge back towards the collector junction for improving the recovery time of the device.

SUMMARY OF THE INVENTION

It is an object of the present invention to provide semiconductor devices having provisions to prevent laterally stored charge which degrades performance of the respective devices.

It is a further object of the invention to provide semiconductor devices having substantially flat buried PN junctions which intersect a layer of isolating material thereby eliminating laterally stored charge areas for improving the operating characteristics of the respective semiconductor devices.

It is a still further object of the instant invention to provide an improved snap diode using insulating layers as a means for limiting the lateral diffusion of dopants and thereby preventing the generation of lateral fields.

It is a further object of the instant invention to provide a hot carrier Schottky type diode wherein the diode structure is surrounded by insulating material and said insulating material defines the area of the PN junction a dopant material is diffused into the diode body over the total area of the surface thereby eliminating any surface PN junction and the attendent lateral charge stored in the device.

Another object of the instant invention is to provide an improved method for manufacturing integrated circuits whereby dielectric isolation techniques are employed for providing buried PN junctions and for eliminating laterally stored electrical charges, which elimination improves the operating characteristic of the subject integrated circuit device.

Another object of the instant invention is to provide a semiconductor device utilizing in combination dielectric isolation techniques along with channel and V etch steps for eliminating surface PN junctions in semiconductor devices.

It is another object of the instant invention to provide various channel etching steps in combination with overlap diffusion techniques for providing semiconductor devices having subsurface base-collector junctions.

Another object of the invention is to provide a method of manufacturing semiconductor devices utilizing a novel sequence of steps for providing such a device having subsurface PN junctions for eliminating the lateral storage charge area of prior art devices.

A still further object of the instant invention is to provide a semiconductor design through which maximum packing density of devices is obtained.

These and other objects and features of this invention become more readily apparent from the following description of the accompanying drawing wherein.

DETAILED DESCRIPTION OF THE INVENTION

Figure 1:
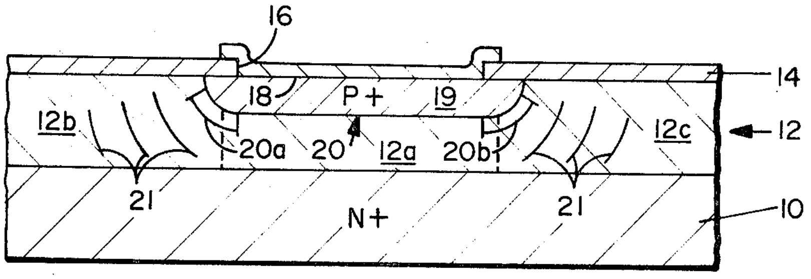
FIG. 1 PRIOR ART
FIG. 1 is a prior art device showing the generation of fringing fields and laterally stored charges during the creation of a PN junction.

Referring to FIG. 1, there is shown a prior art device formed upon an N+ substrate 10 having an N layer 12 epitaxially deposited or otherwise formed upon the substrate 10. A passivation layer 14 of silicon dioxide or other suitable passivating material is formed upon the N epitaxial layer 12 and a window 16 is provided therein by well known prior art techniques. A P+ material is deposited upon the surface 18 of the N epitaxial layer 12 and through the application of heat a P+ diffusion area, having outer limits represented by the line 20, is made. Upon the study of the device manufactured hereby, fringing fields are found to exist at the portions 20A and 20B of the PN junction and are represented by the lines 21. These fringing fields cause a relatively low breakdown voltage of the collector to base with the emitter open, as more completely described in the above mentioned U.S. patent application.

Upon the application of electric field between the P+ material within the diffusion region 20 and the N epitaxial layer 12, a charge is stored beneath the PN junction 20 in the area 12A as well as laterally stored under the oxide layer 14 at 12B and 12C. Obviously, the sweeping away or recombining of the minority carriers stored in the areas 12B and 12C takes a longer time due to the longer distances such carriers have to travel. Those minority carriers stored in the areas 12B and 12C take a longer time due to the lateral displacement from the area 12A. Those minority carriers stored immediately beneath the area 20 in the area 12A are combined or swept away relatively quickly upon the changing of the electric field applied across the aforementioned junction.

Figure 2A:
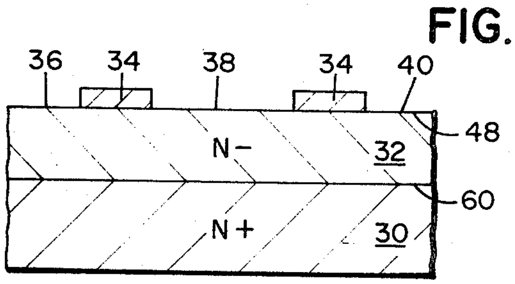
FIGS. 2A through 2D show the formation of a plurality of fully insulated islands utilizing the channel etch procedure.
Figure 2B:
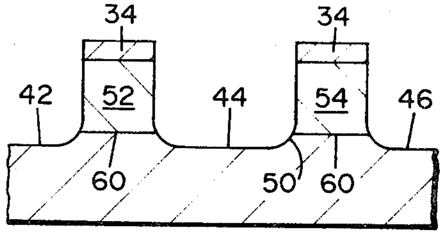
Figure 2C:
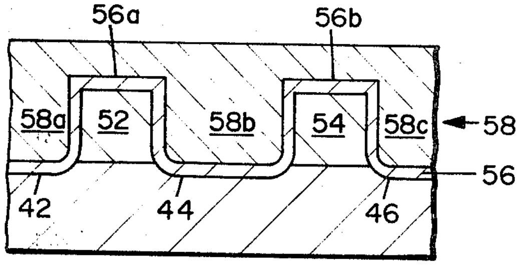
Figure 2D:
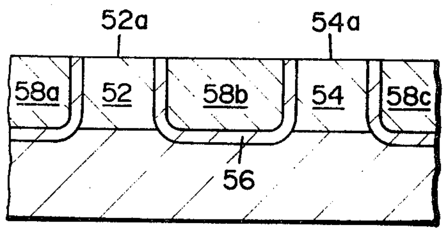

Referring to FIG. 2A, an N+ substrate is shown at 30 upon which an N− epitaxial layer 32 is formed according to standard procedures well known in the prior art. Atop the layer 32 a passivation layer 34 such as silicon dioxide 34 is formed with suitable windows or apertures made at 36, 38 and 40. The composite structure now shown in FIG. 2A is ready for etching, either channel etching or anisotropic etching is suitable for forming the pluralities of grooves 42, 44 and 46 shown in FIG. 2B. In the instance when an anisotropic etching is planned, the layer 32 is oriented having its atomic structure crystallographically oriented to exhibit its [100] surface normal to an upper surface 48 of the layer 32. The crystal structure of the substrate 30 should be oriented in a similar manner when practicing at least one form of the present invention since the grooves 36, 38 and 40 etched in that form, extend slightly into the substrate 30 as shown in FIG. 2B at 50. In another form of the invention, the grooves must abut the substrate 30 in such a manner as to leave no portion of the layer 32 communicating under a groove between adjacent islands. Islands 52 and 54 formed by the etching are defined by the grooves and may take on any geometrical shape desired. More specifically, the grooves 42, 44 and 46 shown with reference to FIG. 2A are shown in a cross sectional view of the device. In a three dimensional view, these grooves extend not only perpendicular into the drawing but also parallel to the plane of the drawing thereby completely defining the plurality of islands 52 and 54. The remaining portion of the passivation layer 34 in FIG. 2B is removed and a new layer 56 of silicon dioxide or other insulating material is formed completely covering the exposed surface of the device as shown in FIG. 2C. More specifically, the surfaces of the plurality of islands 52 and 54 respectively, constructed from portions of the layer 32 by etching, are completely covered by portions **56*a* and 56*b* of the layer 56 of silicon dioxide as shown in FIG. 2C. The grooves 42, 44 and 46 are filled with a polycrystalline silicon member 58, which member extends over top surfaces 56*a* and 56*b* of the islands 52 and 54 and backfills the grooves as at 58*a*, 58*b* and 58*c*. Through normal polishing, grinding and lapping procedures, the excess polycrystalline silicon positioned atop the silicon oxide layers 56*a* and 56*b*, along with the silicon dioxide layers 56*a* and 56*b*, are removed, thereby exposing the upper surfaces of the islands 52 and 54 as at 52*a* and 54*a*** respectively as shown in FIG. 2D. The structure now shown in FIG. 2D is furnished a fresh silicon dioxide passivation layer (not shown) atop the composite structure formed after the polishing back step previously mentioned as an interim step in the manufacture of devices according to the teaching of the present invention.

Figure 2E:
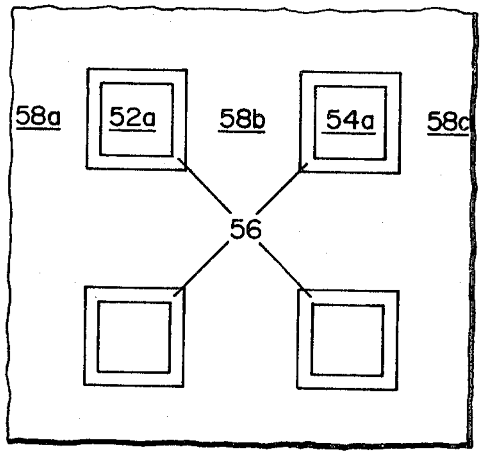
FIG. 2E shows a plan view of a plurality of islands.

The device shown in FIG. 2D comprises a plurality of islands 52 and 54 isolated from each other by a double layer of silicon dioxide 56 and a polycrystalline silicon number 58. Each island, such as island 52, is enclosed by a layer of insulating material such as silicon dioxide 56 insofar as the relatively high resistivity type material 32 forming the island is not in conductive contact with other similar material since the grooves 42, 44 and 46 have penetrated perfectly up to or slightly across a junction 60 (shown in FIGS. 2A and 2B) formed between the layers 30 and 32. The polycrystalline silicon portions **58*a* and 58*b* join to form a closed member for enclosing an insulated island such as island 52** when viewed in plan view such as shown in FIG. 2E.

Figure 3:
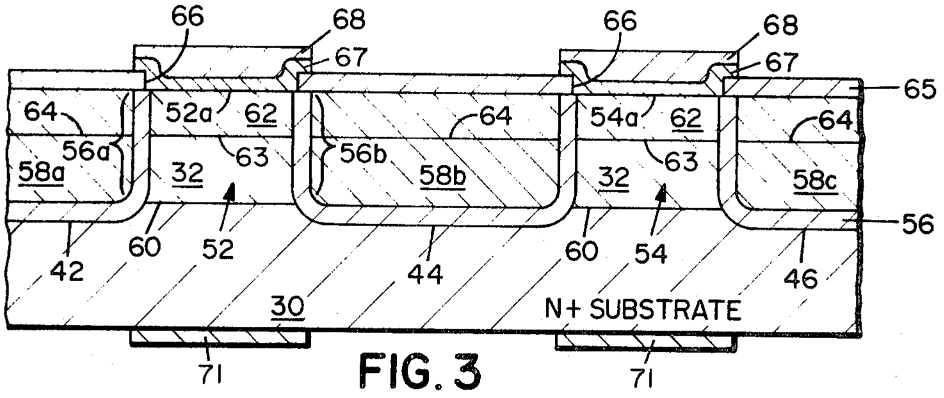
FIG. 3 is a cross sectional view of a Schottky diode manufactured within a fully insulated island of the type shown in FIG. 2D.

The device, shown in FIG. 3, employs the island configuration shown in FIG. 2D as its starting element. More specifically, the passivation layer mentioned with reference to FIG. 2D is formed on the surface of the device shown in FIG. 2D having a plurality of openings for exposing at least the upper surface **52*a* and 54*a* of the islands 52 and 54** respectively.

A P type diffusion step is made through the aforementioned openings froming an opposite conductivity type region 62 in the islands 52 and 54. A line 63 shows the junction between the first conductivity type region 32 and the opposite conductivity type region 62 of the island 52.

As an alternate procedure for forming devices according to the teaching of the present invention, the P type diffusion step is made over the entire surface of the composite structure comprising the plurality of islands 52 and 54, the insulating layers 56 and the polycrystalline member 58 without the formation of a diffusion mask thereon. The insulating layers 56 and the use of a polycrystalline member 58 for backfilling the grooves 42, 44 and 46 makes this possible. In this manner, the diffusion is made into the entire upper surface of such composite structure where a uniform diffusion region 62 of P type conductivity is achieved in each island 52 and 54 and in the surrounding polycrystalline silicon portions **58*a*, 58*b* and 58*c* as represented by a line 63 and an additional line 64** respectively.

An additional masking layer 65 is formed over the composit structure with its diffused regions having openings 66 therein for exposing the upper surfaces **52*a* and 54*a* of the islands 52 and 54 respectively and the silicon dioxide layer 56 enclosing each such island, respectively. A metal layer 67 of molybdenum which is suitable for forming the hot carrier Schottky type diode, or other suitable metal, is deposited through such openings 66. A gold contact 68 completes the diode structure 70. The masking layer 65** covering the composite structure is removable if desired.

An alternate embodiment of the present invention is made by removing through selective etching techniques, the polycrystalline member **58*a*, 58*b* and 58*c* surrounding each island 52 and 54. In this manner, the individual hot carrier Schottky type diodes can be scribed by normal techniques and separated into individual discrete components. While one contact is made to the metal layer, such as 68, the second contact its made to the substrate 30 by a layer 71**.

Figure 4:
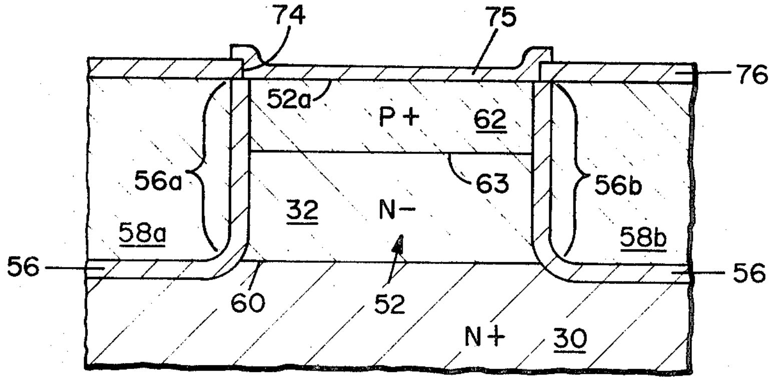
FIG. 4 is a cross sectional view of a snap diode manufactured within a fully insulated island of the type shown in FIG. 2D.

Referring to FIG. 4, an additional embodiment of a diffusion diode is shown employing the structure, shown in FIG. 2D as its starting element. The same numerals employed with reference to FIG. 3 are again employed with reference to FIG. 4 to identify similar members. More specifically, the diode illustrated in FIG. 4 comprises an island 52 of one conductivity type material such as the N-material 32 enclosed by a layer of insulating material 56 and polycrystalline silicon 58. A single diffusion area 62 of opposite type conductivity to that of the epitaxially deposited layer 32 has been formed by diffusion through an opening 74 provided in a diffusion mask 76 according to standard techniques.

Once the diode is formed having a first area of conductivity 32 and an opposite area of conductivity 62, the mask layer 76 formed during the diffusion step is removed and a new layer of silicon dioxide is formed over the island 52 an the surrounding polycrystalline silicon members **58*a* and 58*b*. The new layer has the same configuration as the diffusion mask 76. Accordingly, the new layer is represented by the mask layer 76. The stripping and reformation of the new layer is required because of the need to remove the impurities diffused into the mask 76 during the aforementioned diffusion step. The new layer 76 again has an opening at 74 through which an ohmic metal contact 75 is deposited for contacting the P+ portion of the diode. The second contact is made to the substrate 30** by a contact layer.

By inspection of the diodes shown in FIGS. 3 and 4, it can be seen that they are both characterized as formed with a semiconductor body having an upper region 62 of first conductivity and a lower region 32 of opposite conductivity and a junction 64 therebetween. Each such diode is formed having an upper surface **52*a* and a lower surface 60 and a junction 63 therebetween substantially parallel to the upper surface. Each such diode is further characterized as having its anode and cathode regions substantially the same size without any lateral portion. A lateral portion is an area displaced from under the junction 63. Substantially vertical portion 56*a* and 56*b* of layer 56, as shown in FIGS. 3 and 4, define the relative size of the diodes, anode and cathode area. Furthermore, a silicon dioxide insulating layer 56 surrounds the island portion of N− material and covers the PN junction forming the diode. No edge of the junction 63 terminates on the upper surface 52*a*** of the diode.

Figure 5A:
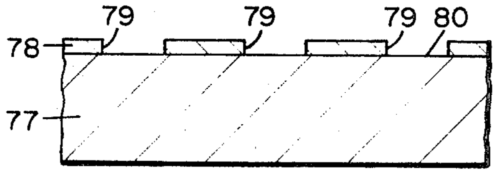
FIGS. 5A through 5D show the various steps employed in the manufacture of a plurality of fully insulated islands utilizing the anisotropic etching procedure.

Referring to FIG. 5A, an N+ substrate 77 is shown having a passivation layer 78 formed thereon, which layer 78 is equipped with a plurality of openings at 79. The substrate material 77 is of a type having its atomic structure crystallographically oriented to exhibit its [100] surface normal to its upper surface 80 making it suitable for anisotropic removal of portions of said substrate 77 exposed through the openings 79. A plurality of grooves is shown constructed according to the aforementioned anisotropic etching procedure in FIG. 5B. Since FIG. 5B is a cross sectional view of the composite body, it should be borne in mind that the grooves are formed in such a way as to completely surround a plurality of islands shown as 81 and 82 in FIG. 5B.

These islands, as hereinafter described, are the members into which semiconductor devices are to be formed. The passivation layer 78 shown in FIG. 5B can be removed and a fresh layer of silicon dioxide 83, functioning as an insulation layer, is formed over the islands 81 and 82 including a plurality of grooves 84, 86 and 88 as shown in FIG. 5C. The thickness of the passivating insulating layer 83 is not critical. Upon this insulating layer 83, a polycrystalline member 90 is formed filling the grooves 84, 86 and 88 and extending a desired amount above lower surfaces 92 and 94 of islands 81 and 82 respectively. The polycrystalline member 90 comprises a "handle" and is utilized for holding the composite structure during subsequent steps of polishing, lapping and grinding whereby a uniform amount of substrate 77 and layer 83 is removed to a depth indicated by the line 96 shown in FIG. 5C.

Figure 5B:
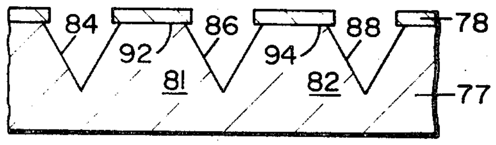
Figure 5C:
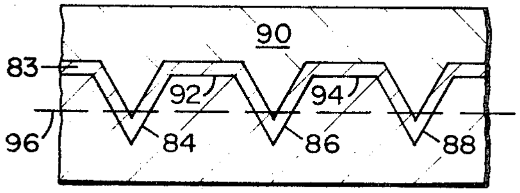

The device manufactured according to the techniques described with reference to FIGS. 5A, 5B and 5C is now turned over and a fresh layer of silicon dioxide 98 is formed thereon on upper surface 100 of the composite body including upper surfaces 102 and 104 of islands 81 and 82 respectively. It should be noted that adjacent islands are insulated by a double layer of insulating material as with portions **83*a* and 83*b*** shown in FIG. 5D. The device as shown in FIG. 5D is now suitable to act as the building block for transistors shown with reference to FIGS. 6B and 8B.

Figure 5D:
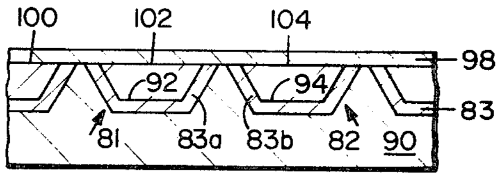

The passivation layer 98 shown with reference to FIG. 5D is formed with a plurality of openings therethrough, each window exposing a corresponding portion of each island 81 and 82, respectively, for a series of diffusions. Since the formation of windows in passivation layers is well known in the prior art, the various steps by which this is done is neither shown nor described in detail but rather the diffusion regions generated by these steps is shown and is considered sufficient for teaching the use of the present invention. Through the aforementioned windows opened in the passivation layer 98, base regions 106 and 108 are created in respective islands 81 and 82, including junctions 110 and 112 respectively having an edge terminating on upper surfaces 102 and 104. Through additional diffusion openings, emitter regions 114 and 116 are formed, respectively, in the islands 78 and 80 including junctions 118 and 120 respectively having an edge terminating on upper surfaces 102 and 104. A final optional diffusion is simultaneously performed into the islands 81 and 82 for forming an N+ enhancement region 122 and 124 respectively.

Figure 6A:
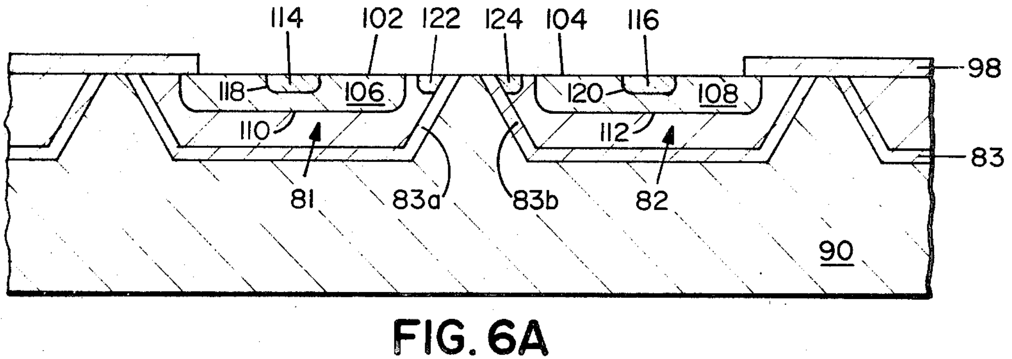
FIGS. 6A and 6B show different stages of manufacture of one embodiment of a transitor fashioned according to the teaching of the present invention.

The structure described with reference to FIG. 6A comprises a plurality of islands 81 and 82 having a plurality of PN junctions formed therein, presently each junction includes an edge terminating at the surface of the islands. The first base junction completely surrounds the second emitter junction as therein shown. An N+ enhancement region 122 is shown having a portion of its edge terminating at the surface of the island and a further portion of the edge terminating against the silicon dioxide insulating layer **83*a*. As an alternate embodiment, the N+ enhancement region 122 need not be constructed according to the teachings of the last mentioned U.S. patent application but rather could have the same configuration as the PN junction shown with reference to the base area 106 or 108 in either of the islands 81 and 82**, respectively. Although FIG. 6A shows a cross sectional view of the pair of islands, it is to be noted that these devices are to be manufactured in the preferred embodiment, as a plurality of individual islands. These islands are arranged in rows and columns whereby maximum yields are obtainable insofar as base, emitter and N+ enhancement region diffusions may be performed in long stripes, each stripe and each diffusion extending across a plurality of islands selectively identified as either in a row or a column configuration depending upon which direction is chosen.

Figure 7A:
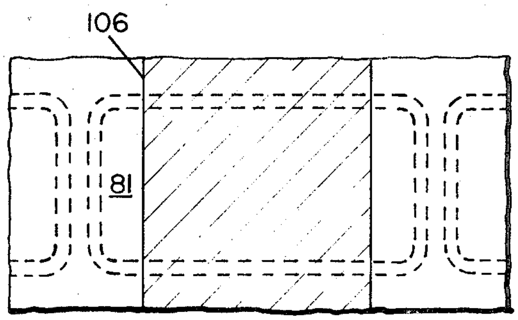
FIGS. 7A and 7B show certain of the steps employed in the manufacture of the transistor illustrated in FIG. 6B.
Figure 7B:
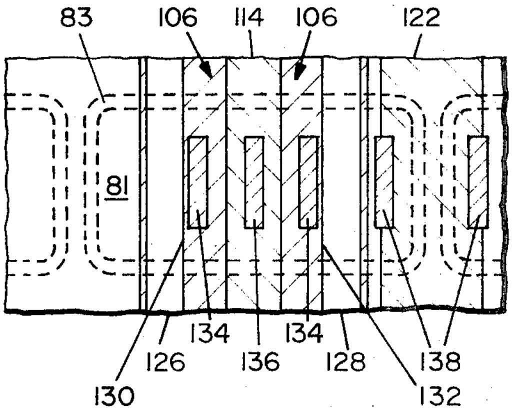

Referring more specifically to FIG. 7A, the base diffusion 106 is shown therein extending across a single island 81 but indicating that the base diffusion continues on to the top and bottom of the figure into a plurality of adjacent islands arranged as a row or column. Referring to FIG. 7B, the base 106, emitter 114, and an N+ enhancement region 122 are shown as extending in long stripes across the single island 81 used for illustration of the diffusion technique employed during the manufacture of the subject invention.

The channel etching step to be described hereinafter with greater detail with reference to FIG. 6B forms long grooves 126 and 128 formed at edges 130 and 132 of the base diffusion area 106. The function of the grooves shown with reference to FIG. 7B is to etch out and remove, or isolate that portion of the base collector PN junction 110 which extends from internal the semiconductor islands 81 and 82 and curves upward toward the surface of each island. A layer 133 of insulating material such as silicon dioxide is formed over the upper surfaces 102 and 104 of the islands 81 and 82 and the grooves 126 and 128.

Referring again to FIG. 6B, the grooves 126 and 128 are shown with reference to the island 81 as extending transversely across the upper surface 102 of the island 81 and extending substantially vertically into the island body to a depth calculated to intersect the base collector PN junction 110. The grooves 126 and 128 are shown spatially removed from those portions 110*a* and 110*b* of the PN junction 110 which are bending upward towards the surface 102 of the island 81. This embodiment of the present invention isolates the portions 110*a* and 110*b* from the remaining portion 110 of the PN junction which is substantially parallel to the upper surface 102 of the island 81. Base and emitter and collector contacts 134, 136 and 138 are formed respectively according to prior art techniques wherein portions of a silicon dioxide layer 133 are retained for protecting each PN junction and proper metallization contacts are made through remaining portions of the silicon dioxide layer for contacting the base, emitter and N+ enhancement regions.

In the manufacture of devices not employing the overlap diffusion technique wherein the base diffusion is established in long stripes across adjacent islands in a column. The base is individually diffused into the surface of the device forming a junction having an edge extending to the surface. The usual shape is circular or rectangular and the groove is formed internal the edge for isolating a portion of the base and eliminating the fringing field area of the device.

Figure 8A:
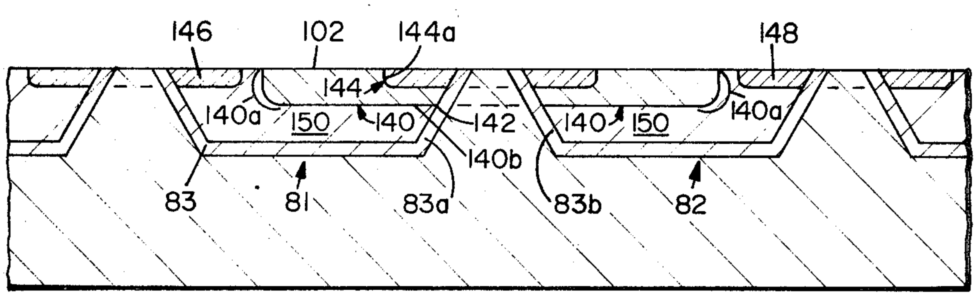
FIGS. 8A and 8B show different stages of manufacture of a second embodiment of a transistor fashioned according to the teaching of the present invention.
Figure 8B:
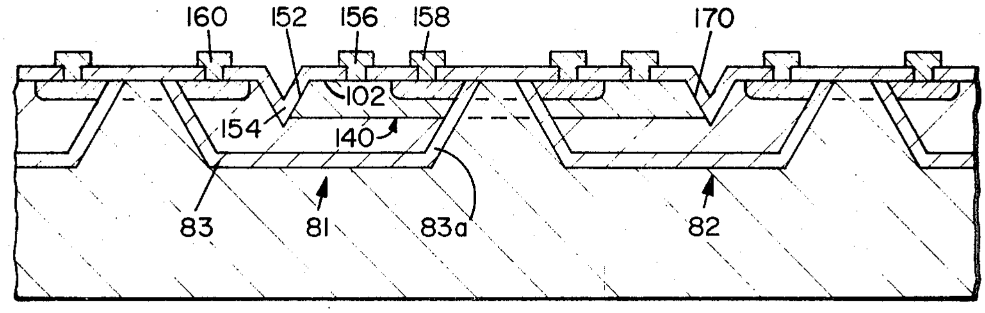

Referring to FIG. 8A, there is shown an additional embodiment of the instant invention whereby overlap diffusion techniques are employed for constructing the PN junctions contained within the semiconductor islands 81 and 82. This embodiment features two techniques, the first of which is the removal of the upward curving portion of the base junction and the second is the burial of another portion of the base junction through overlap diffusion techniques. The base collector PN junction is illustrated by a line 140 shown having a first portion 140*a* of the junction 140 bending upward and intersecting the upper surface 102 of the island 81 and a second portion 140*b* of the junction 140 is shown intersecting the silicon dioxide layer 83*a* below the surface of the island 81 at 142. The emitter base junction 144 is shown having a portion 144*a* bending upward to intersect the surface 102 of the island 81. N+ collector enhancement junctions are optionally made and are shown at 146 and 148. Any technique may be employed for making contact with a collector area 150. Referring to FIG. 8B, a groove 152 is shown constructed such as to remove the portion 140*a* of the base collector junction 140 curving to the surface 102.

Figure 6B:
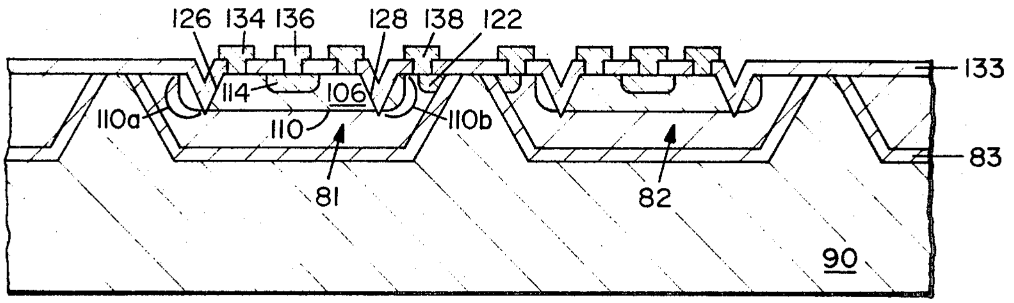

In the manner shown with reference to FIGS. 6B and 8B, the fringing field areas are removed and no longer degrade the performance of the transistor constructed according to the teaching of the instant invention.

Similar to the construction used with respect to the device shown in FIG. 6D, a layer 154 of insulating material such as silicon dioxide is formed over the upper surface 102 of the island 81 including the groove 152. The base-collector junction 140 is terminated now at the oxide layer 154 in the groove 152 and at the vertical portion 83*a* of the oxide layer 83 enclosing the island 81. In this manner, no fringing fields are available since the PN junction 140 intersects the silicon dioxide level substantially parallel to the upper surface 102 of the island 81. The metallizations are applied to the transistor as shown in FIG. 8B according to techniques well known in the prior art and include base, emitter and collector contacts 156, 158 and 160 respectively.

Figure 9:
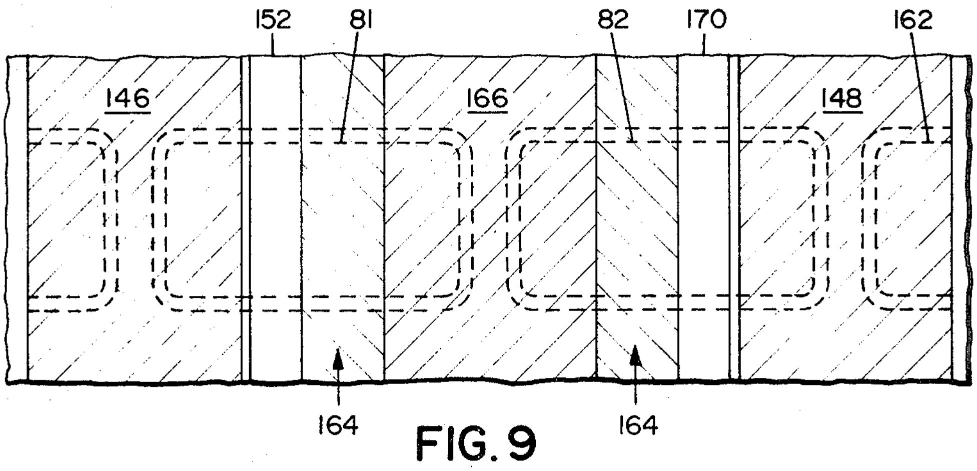
FIG. 9 shows certain of the steps utilized in the manufacture of the transistors shown in FIG. 8B.

Referring briefly to FIG. 9, there is shown the various diffusion steps employed in constructing the device shown in FIG. 8B. A plurality of islands 81, 82 and 162 are shown arranged in a single row. A base diffusion 164 is shown overlapping a pair of adjacently positioned islands located in adjacent columns of islands. Thereafter, through a smaller diffusion window, which exposes only a portion of the previously diffused surfaces of the islands 81 and 82, an emitter diffusion is shown represented by the area 166. The emitter diffusion is shown overlapping the same pair of adjacently located islands 81 and 82. The collector enhancement regions 146 and 148 are shown arising from a single diffusion 168 overlapping the islands 82 and 162 located in different columns of islands. Finally, the grooves 152 and an additional groove 170 are shown formed in such a manner as to obliterate that portion of the base collector junction extending upward to intersect the surface of the islands 81 and 82.

Transistors constructed according to the teaching of the present invention have an improved structure whereby fringing fields are removed by the use of a plurality of grooves which terminate the base-collector junctions as shown with reference to FIG. 6B or a single groove shown with reference to FIG. 8B. In the latter case, the insulated structure of the device provides through means of the overlap diffusion technique the subsurface termination of the base collector junction.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the manufacture of a semiconductor structure of the type which comprises a plurality of islands of first conductivity type, monocrystalline material arranged in rows and columns on the major surface of the structure, and each island having a surface substantially coplanar with the major surface of the structure, and each island being isolated from an adjacent island by a first layer of insulating material, and wherein the first layer of insulating material terminates on the major surface of the semiconductor structure, and wherein the first layer of insulating material functions to define at least the sidewalls of a corresponding island, the method of forming a region of opposite conductivity type in at least a plurality of islands, comprising the steps of:

forming a first mask on the major surface of the semiconductor structure;

forming an opening in said mask and exposing a stripe-like portion of a plurality of islands arranged in a column and separated by portions of corresponding first layers of insulating material;

diffusing a dopant material through said opening for altering the first conductivity-type material to opposite conductivity-type material and simultaneously forming in a plurality of said islands an equal plurality of separate PN junctions respectively and each of said PN junctions terminating in part on respective planar surfaces of each island and in part against respective first layers of insulating material;

forming a pair of grooves in said planar surface of each island and each of said grooves extending vertically into said island through said opposite conductivity-type material and terminating at a first end located within said first conductivity-type material, and extending transversely across said planar surface of each respective island coextensive with each of said PN junctions and terminating at respective ones of said first layers of insulating material; and forming a second layer of insulating material within said pair of grooves and joined with said first layer.

2. In the manufacture of a semiconductor structure of the type which comprises a plurality of islands of first conductivity-type, monocrystalline material arranged in rows and columns on the major surface of the structure, and each island having a surface substantially coplanar with the major surface of the structure, and each island being isolated from the adjacent island by a first layer of insulating material, and wherein the first layer of insulating material terminates on the major surface of the semiconductor structure, and wherein the first layer of insulating material functions to define at least the sidewalls of a corresponding island, the method of forming a region of opposite conductivity-type in at least a plurality of islands comprising the steps of:

forming a first mask on the major surface of the semiconductor structure;

forming an opening in said mask and exposing a stripe-like portion of each island in a pair of adjacent columns and the portions of corresponding first layers of insulating material positioned intermediate adjacent islands;

diffusing a dopant material through said opening for altering the fist conductivity-type material to opposite conductivity-type material and simultaneously forming in a plurality of said islands an equal plurality of separate PN junctions respectively and each of said PN junctions terminating in part at respective planar surfaces of each island and in part against respective first layers of insulating material;

forming a groove in said planar surface of each island and each of said grooves extending vertically into said island through said opposite conductivity-type material and terminating at a first end located within said first conductivity-type material, and extending transversely across said planar surface of each respective island coextensive with said portion of said PN junction terminating at said planar surface, and said groove terminating at respective ones of said first layers of insulating material; and forming a second layer of insulating material within said pair of grooves and joined with said first layer.

3. The method of making semiconductor devices comprising the steps of:

providing a silicon semiconductor body of a first conductivity type having at least an upper surface and a lower surface and having its atomic structure crystallographically oriented to exhibit its [100] surface normal to said upper surface;

anisotropically etching selected portions of said body and thereby forming a groove extending vertically into said body and terminating at a first end and extending transversely across said upper surface forming a plurality of closed members for enclosing a plurality of islands formed in said body and arranged in a plurality of rows and columns;

coating said uper surface and said groove with an insulating layer;

filling said coated groove and forming a second layer of polycrystalline silicon on said insulating layer;

removing in a substantially uniform manner equal thicknesses of said body for exposing said polycrystalline silicon formed in each groove and for forming a plurality of islands of said first conductivity type and each island having a planar surface and each island being separated from each other island by a plurality of insulating layers and a polycrystalline layer;

forming a first diffusion mask having a first opening exposing a stripe like portion of a plurality of islands arranged in a column;

diffusing a dopant material through said opening for altering said first conductivity type material to opposite conductivity type material and simultaneously forming in a plurality of said islands an equal plurality of separate PN junctions respectively and each of said PN junctions having first and second edges located substantially parallel with each other and terminating on said planar surface and each extending transversely across said body;

forming a pair of grooves in said planar surface of each island and each of said grooves extending vertically into said body through said opposite conductivity type material and terminating at a first end located within said first conductivity type body and extending transversely across said planar surface of each island substantially parallel with each of said PN junctions;

forming a second region in each island of first conductivity type material within each region of said opposite conductivity type material;

providing a plurality of contacts adherent to each of said conductivity type region.

4. The method of making a plurality of semiconductor devices comprising the steps of:

providing a silicon semiconductor body of a first conductivity type having at least an upper surface and a lower surface and having its atomic structure crystallographically oriented to exhibit its [100] surface normal to said upper surface;

anisotropically etching selected portions of said body and thereby forming a groove extending vertically into said body and terminating at a first end and extending transversely across said upper surface forming a plurality of closed members for enclosing a plurality of islands formed in said body and arranged in a plurality of rows and columns;

coating said upper surface and said groove with an insulating layer;

filling said coated groove and forming a second layer of polycrystalline silicon on said insulating layer;

removing in a substantially uniform manner equal thicknesses of said body for exposing said polycrystalline silicon formed in each groove and for forming a plurality of islands of said first conductivity type and each island having a planar surface and each island being separated from each other island by a plurality of insulating layers and a polycrystalline layer;

forming a first diffusion mask having a first opening exposing a stripe like portion of each island in a pair of adjacent columns;

diffusing a dopant material through said opening for altering said first conductivity type material to opposite conductivity type material and simultaneously forming in a plurality of said islands an equal plurality of separate PN junctions respectively and each of said PN junctions having first and second edges located substantially parallel with each other and one of said edges terminating on said planar surface and each extending transversely across said body and a second of said edges terminating below said planar surface abutting said insulating layer;

forming a groove in said planar surface of each island and said groove extending vertically into said body through said opposite conductivity type material and terminating at a first end located within said first conductivity type body and extending transversely across said planar surface of each island substantially parallel with said PN junction terminating on said surface;

forming a second region in each island of first conductivity type material within each region of said opposite conductivity type material;

providing a plurality of contacts adherent to each of said conductivity type region.

References Cited

UNITED STATES PATENTS

| | | | |
|---|---|---|---|
| 3,294,600 | 12/1966 | Yokota | 317—235 AK |
| 3,345,222 | 10/1967 | Nomura et al. | 148—175 |
| 3,369,290 | 2/1968 | Mayer et al. | 317—235 AK |
| 3,411,051 | 11/1968 | Kilby | 317—235 |
| 3,411,200 | 11/1968 | Formigoni | 29—580 |
| 3,426,253 | 2/1969 | La Rocque et al. | 317—234 |
| 3,432,919 | 3/1969 | Rosvold | 29—578 |
| 3,534,234 | 10/1970 | Clevenger | 317—235 |
| 3,566,219 | 2/1971 | Nelson | 317—235 |
| 3,575,646 | 4/1971 | Karcher | 317—235 |
| 3,575,741 | 4/1971 | Murphy | 148—175 |
| 3,509,433 | 4/1970 | Schroeder | 317—234 |

OTHER REFERENCES

Elctronics Review Section of Electronics, Nov. 11, 1968, pp. 53–55.

Lee, F. H., "Dielectrically Isolated Saturating Circuits," IEEE Trans. on Electron Dev., vol. Ed.–15, No. 9, September 1968, pp. 645–650.

CHARLES N. LOVELL, Primary Examiner

W. G. SABA, Assistant Examiner

U.S. Cl. X.R.

29—578, 580; 117—201, 212; 148—187; 156—17 317—235 R